US010719008B2

(12) United States Patent
Seo et al.

(10) Patent No.: US 10,719,008 B2
(45) Date of Patent: Jul. 21, 2020

(54) PHASE-SHIFT MASK FOR EXTREME ULTRAVIOLET LITHOGRAPHY

(71) Applicant: Samsung Electronics Co., Ltd., Suwon-si, Gyeonggi-do (KR)

(72) Inventors: Hwanseok Seo, Suwon-si (KR); SeongSue Kim, Seoul (KR); Taehoon Lee, Suwon-si (KR); Roman Chalykh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 34 days.

(21) Appl. No.: 15/625,049

(22) Filed: Jun. 16, 2017

(65) Prior Publication Data

US 2018/0143527 A1 May 24, 2018

(30) Foreign Application Priority Data

Nov. 22, 2016 (KR) .......................... 10-2016-0155972

(51) Int. Cl.
*G03F 1/22* (2012.01)
*G03F 1/24* (2012.01)
*G03F 1/26* (2012.01)
*G03F 1/52* (2012.01)

(52) U.S. Cl.
CPC ................. *G03F 1/26* (2013.01); *G03F 1/22* (2013.01); *G03F 1/24* (2013.01); *G03F 1/52* (2013.01)

(58) Field of Classification Search
CPC ........ G03F 1/0046; G03F 1/0076; G03F 1/24; G03F 1/26; G03F 1/52; G03F 1/22; G03F 1/36
See application file for complete search history.

(56) References Cited

U.S. PATENT DOCUMENTS

| 6,986,974 | B2 | 1/2006 | Han et al. | |
|---|---|---|---|---|
| 8,288,062 | B2 | 10/2012 | Hayashi et al. | |
| 8,367,279 | B2 | 2/2013 | Shoki | |
| 8,372,564 | B2 | 2/2013 | Shoki | |
| 2002/0110743 | A1* | 8/2002 | Shoki | ........................ B32B 7/02 430/5 |
| 2003/0211399 | A1* | 11/2003 | Chang | ....................... G03F 1/50 430/5 |
| 2005/0084768 | A1* | 4/2005 | Han | ....................... B82Y 10/00 430/5 |
| 2007/0128528 | A1* | 6/2007 | Hess | ....................... B82Y 10/00 430/5 |
| 2008/0254376 | A1* | 10/2008 | Lin | .......................... G03F 1/32 430/5 |

(Continued)

FOREIGN PATENT DOCUMENTS

| JP | 5711533 B2 | 5/2015 |
|---|---|---|
| JP | 5716146 B1 | 5/2015 |

(Continued)

*Primary Examiner* — Martin J Angebranndt
(74) *Attorney, Agent, or Firm* — Harness, Dickey & Pierce, P.L.C.

(57) ABSTRACT

A phase-shift mask for extreme ultraviolet (EUV) lithography may be provided. The phase-shift mask may include a substrate, a reflection layer on the substrate, and phase-shift patterns including at least one metal nitride on the reflection layer. The at least one metal nitride may include at least one of TaN, TiN, ZrN, HfN, CrN, VN, NbN, MoN, WN, AlN, GaN, ScN, and YN.

20 Claims, 11 Drawing Sheets

(56) References Cited

U.S. PATENT DOCUMENTS

| | | | | |
|---|---|---|---|---|
| 2009/0170011 A1* | 7/2009 | Ahn | ................... | B82Y 10/00 |
| | | | | 430/5 |
| 2009/0220869 A1* | 9/2009 | Takai | ................... | B82Y 10/00 |
| | | | | 430/5 |
| 2010/0119958 A1* | 5/2010 | Yoo | ................... | B82Y 10/00 |
| | | | | 430/5 |
| 2010/0304277 A1* | 12/2010 | Oh | ................... | B82Y 10/00 |
| | | | | 430/5 |
| 2011/0020737 A1* | 1/2011 | Kamo | ................... | B82Y 10/00 |
| | | | | 430/5 |
| 2011/0027703 A1* | 2/2011 | Shoki | ................... | B82Y 10/00 |
| | | | | 430/5 |
| 2011/0183240 A1* | 7/2011 | Hashimoto | ................... | G03F 1/32 |
| | | | | 430/5 |
| 2013/0065163 A1* | 3/2013 | Tanaka | ................... | G03F 1/24 |
| | | | | 430/5 |
| 2013/0260311 A1* | 10/2013 | Chang | ................... | G03F 7/0397 |
| | | | | 430/270.1 |
| 2014/0272678 A1* | 9/2014 | Shih | ................... | G03F 1/24 |
| | | | | 430/5 |
| 2014/0370424 A1* | 12/2014 | Onoue | ................... | G03F 1/24 |
| | | | | 430/5 |
| 2015/0212402 A1* | 7/2015 | Patil | ................... | G03F 1/24 |
| | | | | 430/5 |
| 2016/0147138 A1 | 5/2016 | Shih et al. | | |
| 2016/0147139 A1 | 5/2016 | Onoue et al. | | |
| 2016/0161837 A1 | 6/2016 | Hamamoto et al. | | |
| 2016/0238925 A1 | 8/2016 | Hamamoto et al. | | |

FOREIGN PATENT DOCUMENTS

| | | |
|---|---|---|
| KR | 20140066563 A | 6/2014 |
| KR | 101615890 B1 | 4/2016 |

\* cited by examiner

PHASE-SHIFT MASK FOR EXTREME ULTRAVIOLET LITHOGRAPHY

CROSS-REFERENCE TO RELATED APPLICATIONS

This U.S. non-provisional patent application claims priority under 35 U.S.C. § 119 to Korean Patent Application No. 10-2016-0155972, filed on Nov. 22, 2016, in the Korean Intellectual Property Office, the entire contents of which are hereby incorporated by reference.

BACKGROUND

The present disclosure relates to a mask for extreme ultraviolet lithography, and in particular, to a phase-shift mask for extreme ultraviolet lithography.

A reduction in size and design rule of a semiconductor device leads to an increasing demand for a technique to reduce a size of a pattern. In order to meet such a demand, a light source configured to emit light of a shorter wavelength in a lithography process may be used. For example, lights of 436 nm ("g-line"), 365 nm ("I-line"), 248 nm (e.g., of KrF laser), and 193 nm (e.g., ArF laser) have been used as light sources in the lithography process. Recently, the extreme ultraviolet (EUV) light of 13.5 nm has been suggested as a light source for EUV lithography.

Because most of the EUV light is absorbed by refractive optical materials, a reflective optical system, instead of a refractive optical system, is used in the EUV lithography.

SUMMARY

Some example embodiments of inventive concepts provide an EUV phase-shift mask including phase-shift patterns, whose refractive index and extinction coefficient characteristics can be easily controlled.

Some example embodiments of inventive concepts provide an EUV phase-shift mask capable of forming photoresist patterns with improved structural characteristics (e.g., line-width roughness and CD uniformity).

According to some example embodiments of inventive concepts, a phase-shift mask for extreme ultraviolet (EUV) lithography may include a substrate, a reflection layer on the substrate, and phase-shift patterns including at least one metal nitride on the reflection layer. The at least one metal nitride may include at least one of TaN, TiN, ZrN, HfN, CrN, VN, NbN, MoN, WN, AlN, GaN, ScN, and YN.

According to some example embodiments of inventive concepts, a phase-shift mask for EUV lithography may include a substrate, a reflection layer on the substrate, and phase-shift patterns including two different metal nitrides on the reflection layer. The two different metal nitrides may include two different one of TaN, TiN, ZrN, HfN, CrN, VN, NbN, MoN, WN, AlN, GaN, ScN, and YN.

According to some example embodiments of inventive concepts, a phase-shift mask for EUV lithography may include a substrate, a reflection layer on the substrate, and phase-shift patterns on the reflection layer. The phase-shift patterns may include one of TiN, ZrN, and VN.

According to some example embodiments of inventive concepts, a phase-shift mask including a substrate, a reflection layer on the substrate, and phase-shift patterns including at least one metal nitride on the reflection layer. The phase-shift patterns define an opening through a thickness direction of the phase-shift patterns. The phase-shift patterns are configured to change a phase of EUV light passing through the phase-shift patterns by 160° to 200° compared to EUV light passing through the opening. The phase-shift patterns have a refractive index in a range of 0.90 to 0.95, and the phase-shift patterns have an extinction coefficient in a range of 0.005 to 0.030.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

Figure 1:
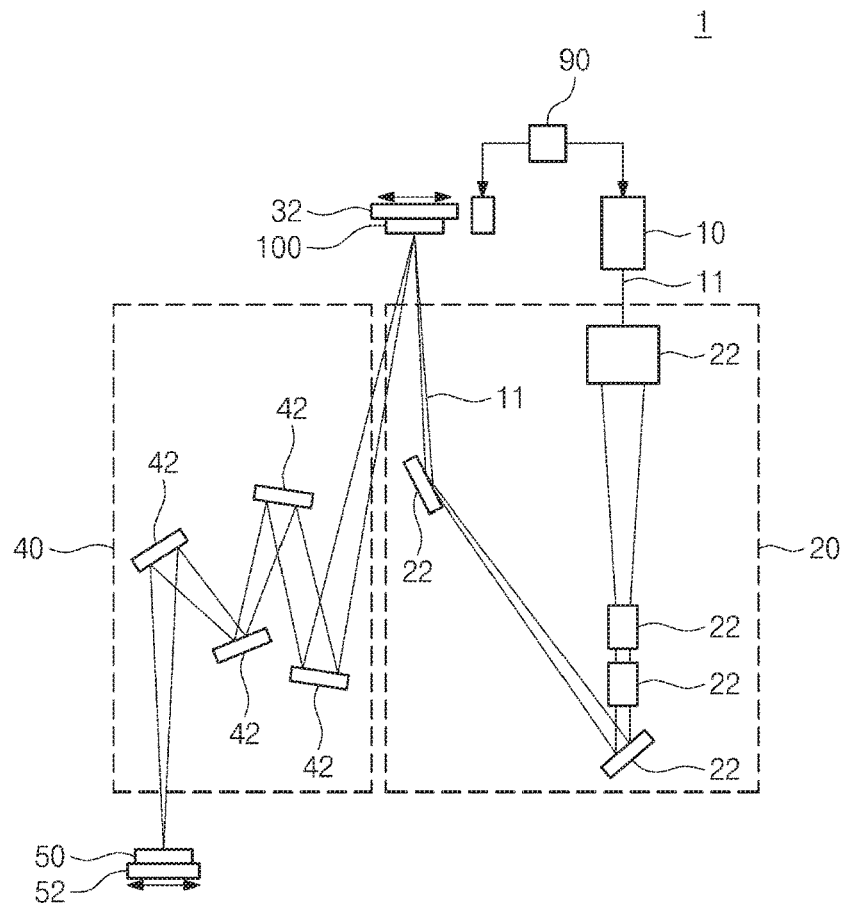
FIG. 1 is a schematic diagram illustrating an extreme ultraviolet lithography system, in which a phase-shift mask according to some example embodiments of inventive concepts is used.

FIG. 1 is a schematic diagram illustrating an extreme ultraviolet (EUV) lithography system, in which a phase-shift mask according to some example embodiments of inventive concepts is used.

Referring to FIG. 1, an EUV lithography system 1 may include an optical source unit 10, a condenser unit 20, a projection unit 40, and a control unit 90.

The optical source unit 10 may be configured to generate an EUV light 11 (e.g., light having a wavelength of about 13.5 nm).

The condenser unit 20 may be configured to allow the EUV light 11 to be propagated from the optical source unit 10 toward a phase-shift mask 100 loaded on a mask stage 32. The condenser unit 20 may include condenser optics 22 (e.g., lenses and/or mirrors). The condenser optics 22 may be configured to collect and reflect the EUV light 11, and the collection and reflection of the condenser optics 22 may be used to guide the EUV light 11 toward the phase-shift mask 100. In some example embodiments, the condenser unit 20 may be configured to allow the EUV light 11 to be obliquely incident into the phase-shift mask 100.

The mask stage 32 may be configured to load the phase-shift mask 100 thereon and to move the phase-shift mask 100. The optical source unit 10 and the mask stage 32 may be controlled by the control unit 90.

If the EUV light 11 is incident into the phase-shift mask 100, it may be reflected by the phase-shift mask 100 and then may be incident into the projection unit 40. The projection unit 40 may be used to project a pattern image of the phase-shift mask 100 on a target substrate 50, which is loaded on a substrate stage 52. The target substrate 50 may be a wafer, on which integrated circuits are formed. The target substrate 50 may be coated with a photoresist layer having a photosensitive property. The substrate stage 52 may be configured to change a position of the target substrate 50, and this may make it possible to change a position of a region of the target substrate 50 to be exposed to the EUV light 11.

The projection unit 40 may include projection optics 42 (e.g., lenses and/or mirrors). The projection optics 42 may be configured to perform an exposure process of projecting the pattern image of the phase-shift mask 100 on the target substrate 50 using the EUV light 11 reflected from the phase-shift mask 100. In some example embodiments, the exposure process may be performed to reduce a size of the pattern image to a desired (and/or alternatively predetermined) magnification (e.g., 4 times, 6 times, or 8 times).

Figure 2:
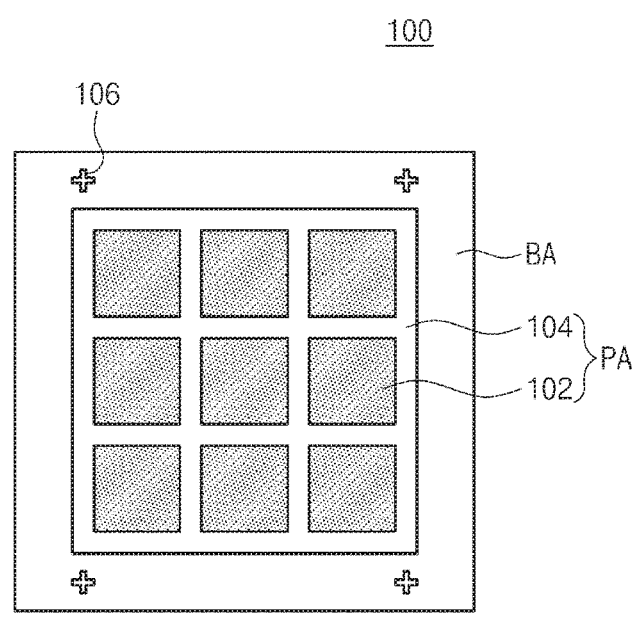
FIG. 2 is a plan view schematically illustrating the phase-shift mask of FIG. 1.

FIG. 2 is a plan view schematically illustrating the phase-shift mask of FIG. 1.

Referring to FIG. 2, the phase-shift mask 100 may include a pattern region PA and a black border region BA.

The pattern region PA may include a main pattern region 102 and an auxiliary pattern region 104. The main pattern region 102 may include main patterns for forming integrated circuits on a chip region of a target substrate (e.g., 50 of FIG. 1), and the auxiliary pattern region 104 may include auxiliary patterns for forming corresponding auxiliary patterns on a scribe line region of the target substrate 50.

The black border region BA may surround the pattern region PA, and in some example embodiments, any pattern may not be formed on the black border region BA. A fiducial mark 106 may be provided on the black border region BA. The fiducial mark 106 may be used as a reference point (e.g., the origin of a coordinate system) for describing positions of defects, which may be produced in a process of forming thin layers constituting the phase-shift mask 100. Although four fiducial marks 106 are illustrated in FIG. 2, inventive concepts are not limited thereto.

Figure 3:
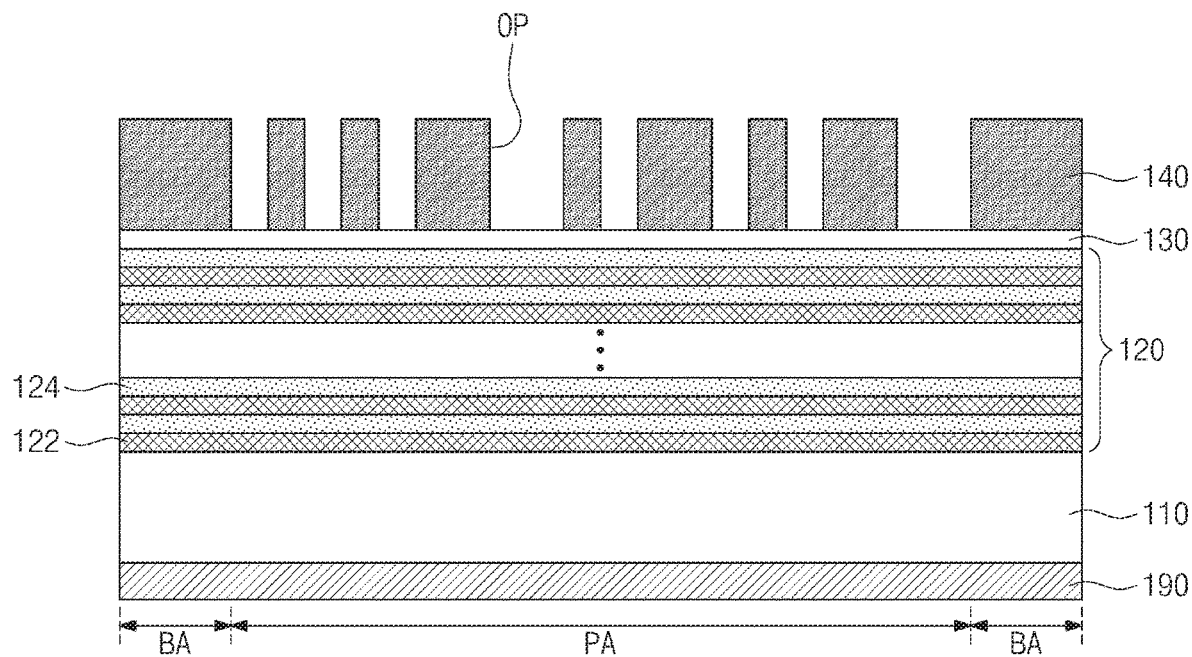
FIG. 3 is a sectional view schematically illustrating an EUV phase-shift mask according to some example embodiments of inventive concepts.
Figure 4:
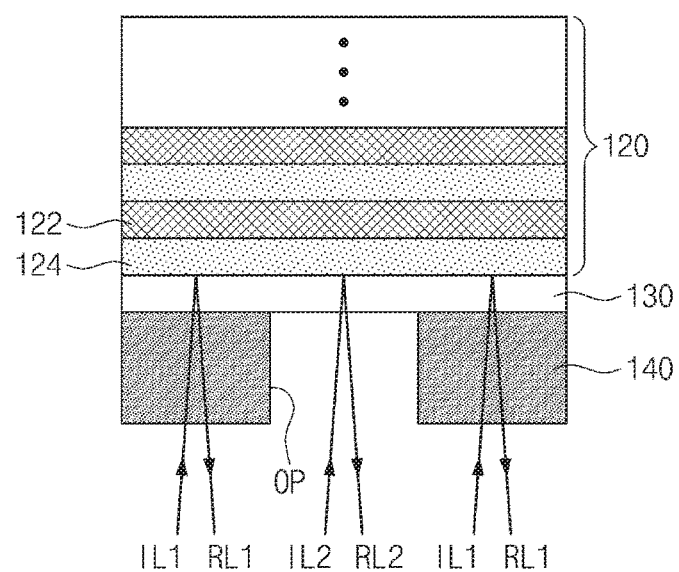
FIG. 4 is a schematic diagram that is provided to describe an optical behavior of EUV light, when the EUV light is reflected by an EUV phase-shift mask according to some example embodiments of inventive concepts.

FIG. 3 is a sectional view schematically illustrating an EUV phase-shift mask according to some example embodiments of inventive concepts. For example, the EUV phase-shift mask of FIG. 3 may correspond to the phase-shift mask 100 described with reference to FIGS. 1 and 2. FIG. 4 is a schematic diagram that is provided to describe an optical behavior of EUV light, when the EUV light is reflected by an EUV phase-shift mask according to some example embodiments of inventive concepts.

Referring to FIG. 3, a phase-shift mask may include a substrate 110, a reflection layer 120, a capping layer 130, phase-shift patterns 140, and a conductive bottom layer 190.

The substrate 110 may include a material with a low thermal expansion property. In addition, the material for the substrate 110 may be selected to have superiority in other physical and chemical properties, such as leveling, flatness, and resistance to cleaning solution. For example, the substrate 110 may be formed of or include synthesized fused silica, quartz glass, alumina silicate glass, soda lime glass, and/or $SiO_2$—$TiO_2$-based glass.

The substrate 110 may include a pattern region PA and a black border region BA, which is provided to surround the pattern region PA. The pattern region PA and the black border region BA may correspond to the pattern region PA and the black border region BA, respectively, which were described with reference to FIG. 2.

The reflection layer 120 may be provided on a top surface of the substrate 110. The reflection layer 120 may be configured to reflect EUV light to be incident thereto.

In some example embodiments, the reflection layer 120 may include a stack of low-refractive-index layers 122 and high-refractive-index layers 124, which are alternately stacked one on top of the other. For example, the reflection layer 120 may include 20 to 80 unit stacks, which are sequentially stacked one on top of the other, and each of which includes a pair of the low- and high-refractive-index layers 122 and 124. The high-refractive-index layers 124 may have a refractive index higher than that of the low-refractive-index layers 122. In some example embodiments, the reflection layer 120 may be provided in such a way that one of the high-refractive-index layers 124 is located at its highest level.

The material and thickness of the low- and high-refractive-index layers 122 and 124 may be adaptively selected depending on a wavelength of EUV light to be incident into the reflection layer 120 and/or requirements for EUV reflectivity in the reflection layer 120. For example, the low-refractive-index layers 122 may be formed of or include molybdenum (Mo), and the high-refractive-index layers 124 may be formed of or include silicon (Si). Each of the low- and high-refractive-index layers 122 and 124 may be provided to have a thickness ranging from about 2 nm to about 5 nm.

In some example embodiments, as shown in FIG. 3, the reflection layer 120 may have a flat top surface. In other words, the reflection layer 120 may have an un-recessed top surface, but inventive concepts are not limited thereto.

The capping layer 130 may be provided on the reflection layer 120. The reflection layer 120 may be interposed between the capping layer 130 and the substrate 110. The capping layer 130 may be used to protect the reflection layer 120 from being damaged and to limit and/or prevent a surface of the reflection layer 120 from being oxidized. The capping layer 130 may be formed of or include, for example, ruthenium (Ru), but inventive concepts are not limited to the above material for the capping layer 130. Furthermore, the capping layer 130 may be an optional element. For example, in some example embodiments, the capping layer 130 may not be provided.

The phase-shift patterns 140 may be provided on the capping layer 130. The capping layer 130 may be interposed between the phase-shift patterns 140 and the reflection layer 120. Some of the phase-shift patterns 140 may be provided on the black border region BA, and the others of the phase-shift patterns 140 may be provided on the pattern region PA. Openings OP exposing the capping layer 130 or the reflection layer 120 may be formed between the phase-shift patterns 140.

Referring further to FIG. 4, the phase-shift patterns 140 may absorb a part of an incident EUV light IL1 to be incident thereto. Accordingly, the incident EUV light IL1 may have reflectivity lower than that of an incident EUV light IL2 to be incident to the openings OP. The reflectivity of the incident EUV light IL1 may vary depending on an extinction coefficient k and a thickness of the phase-shift patterns 140. For example, the smaller the extinction coefficient and thickness of the phase-shift patterns 140, the higher the reflectivity of the incident EUV light IL1. As an example, the reflectivity of the incident EUV light IL2 may range from about 60% to about 75%.

The phase-shift patterns 140 may be configured to shift a phase of the incident EUV light IL1. Accordingly, a reflected EUV light RL1, which is reflected by the reflection layer 120 through a path passing through the phase-shift patterns 140, may have a phase different from that of a reflected EUV light RL2, which is reflected by the reflection layer 120 through a path passing through the openings OP. A shift in phase of the incident EUV light IL1 caused by the phase-shift patterns 140 may be dependent on a refractive index n and a thickness of the phase-shift patterns 140. For example, the smaller the refractive index of the phase-shift patterns 140 and the greater the thickness of the phase-shift patterns 140, the larger the shift in phase of the incident EUV light IL1 caused by the phase-shift patterns 140.

According to some example embodiments of inventive concepts, the reflectivity of the incident EUV light IL1 to be incident to the phase-shift patterns 140 may range from about 4% to about 30% (hereinafter, referred to as a reflectivity condition). In addition, owing to the presence of the phase-shift patterns 140, the reflected EUV light RL1 and the reflected EUV light RL2 may have a phase difference of about 160° to about 200° (hereinafter, referred to as a phase difference condition).

The phase-shift patterns 140 may have a thickness that is suitable for the phase difference condition, and such a thickness of the phase-shift patterns 140 may be determined depending on a refractive index of the phase-shift patterns 140. If a thickness of the phase-shift patterns 140 is determined, reflectivity of the incident EUV light IL1 may be determined based on an extinction coefficient of the phase-shift patterns 140. Thus, to meet both of the reflectivity condition and the phase difference condition, the refractive index and the extinction coefficient of the phase-shift patterns 140 may be controlled to be within suitable ranges.

According to some example embodiments of inventive concepts, to meet the reflectivity condition and the phase difference condition, the phase-shift patterns 140 may be formed of a material, whose refractive index and extinction coefficient are within specific ranges. In some example embodiments, the phase-shift patterns 140 may be formed of or include a material having a refractive index of about 0.9 to about 0.95 and an extinction coefficient of about 0.005 to about 0.03. In some example embodiments, the phase-shift patterns 140 may be formed of or include a material having a refractive index of about 0.92 to about 0.95 and an extinction coefficient of about 0.01 to about 0.02.

The phase-shift patterns 140 may include at least one metal nitride, allowing the refractive index and extinction coefficient of the phase-shift patterns 140 to be within the above ranges. In some example embodiments, the phase-shift patterns 140 may include at least one metal nitride. For example, the phase-shift patterns 140 may include at least one of TaN, TiN, ZrN, HfN, CrN, VN, NbN, MoN, WN, AlN, GaN, ScN, and YN.

In some example embodiments, the phase-shift patterns 140 may be formed of or include one metal nitride. For example, the phase-shift patterns 140 may include one of TiN, ZrN, and VN.

In some example embodiments, the phase-shift patterns 140 may be formed of or include at least two metal nitrides. For example, the phase-shift patterns 140 may include at least two of TaN, TiN, ZrN, HfN, CrN, VN, NbN, MoN, WN, AlN, GaN, ScN, and YN but are different from each other. In some example embodiments, by adjusting kinds of metal nitrides contained in the phase-shift patterns 140 and/or a composition ratio thereof, it may be possible to easily control the refractive index and extinction coefficient of the phase-shift patterns 140. In other words, since a refractive index and an extinction coefficient of the phase-shift patterns 140 are changed depending on the kinds of metal nitrides contained in the phase-shift patterns 140 and the composition ratio thereof, it is possible to easily adjust (and/or optimize) the refractive index and extinction coefficient of the phase-shift patterns 140.

In some example embodiments, the phase-shift patterns 140 may include one metal nitride selected from a first metal nitride group, which exhibits a relatively low reflectivity within a thickness range satisfying the phase difference condition, and another metal nitride selected from a second metal nitride group, which exhibits a relatively high reflectivity within a thickness range satisfying the phase difference condition. The first metal nitride group may include TiN, HfN, TaN, WN, CrN, VN, and GaN. The second metal nitride group may include TiN, ZrN, MoN, NbN, and YN. If TiN is selected from the first metal nitride group, TiN may not be selected from the second metal nitride group. Also, if TiN is selected from the second metal nitride group, TiN may not be selected from the first metal nitride group.

In some example embodiments, TiN may be selected from the first metal nitride group, and ZrN may be selected from the second metal nitride group. In this case, the phase-shift patterns 140 may include $Ti_xZr_{(1-x)}N$. In some example embodiments, the x may range from 0.5 to 0.7.

Table 1 shows refractive indices and extinction coefficients of TiN, ZrN, $Ti_{0.5}Zr_{0.5}N$, and $Ti_{0.7}Zr_{0.3}N$, thicknesses of the phase-shift patterns 140 for realizing a phase difference of 180°, and reflectivity values of EUV light to be incident into the phase-shift patterns 140 with such a thickness.

TABLE 1

| Material | Optical Constants | | Phase Difference = 180° | |
|---|---|---|---|---|
| | Refractive Index | Extinction Coefficient | Thickness (Nm) | Reflectivity (%) |
| TiN | 0.938 | 0.0182 | 52 | 13.4 |
| ZrN | 0.946 | 0.0084 | 59.6 | 28.1 |
| $Ti_{0.5}Zr_{0.5}N$ | 0.9436 | 0.01256 | 58.4 | 19.8 |
| $Ti_{0.7}Zr_{0.3}N$ | 0.9419 | 0.01458 | 57.6 | 16.4 |

Table 1 shows that by adjusting a composition ratio of TiN and ZrN in the phase-shift patterns 140, it is possible to control the refractive index and the extinction coefficient of the phase-shift patterns 140. Furthermore, Table 1 shows that it is possible to control thicknesses of the phase-shift patterns 140 for realizing a phase difference of 180° and reflectivity values of EUV light to be incident into the phase-shift patterns 140 with such a thickness.

In some example embodiments, anti-reflection patterns (not shown) may be provided on the phase-shift patterns 140. The anti-reflection patterns may have a relatively low reflectivity at a wavelength range (e.g., about 190 nm to about 260 nm) of an inspection light, which is used to inspect a phase-shift mask. For example, the anti-reflection patterns may be formed of or include at least one of TaBO, TaBNO, TaOH, TaON, or TaONH. The anti-reflection patterns may be optional elements. For example, in some example embodiments, the anti-reflection patterns may not be provided.

Furthermore, in some example embodiments, the phase-shift patterns 140 may further contain a small amount of an impurity. For example, the impurity may be at least of Si, Ge, B, and H, but inventive concepts are not limited thereto.

The conductive bottom layer 190 may be provided on a bottom surface of the substrate 110. The conductive bottom layer 190 may be provided for an operation of an electrostatic chuck. For example, the conductive bottom layer 190 may be configured to load the EUV phase-shift mask on a mask stage. The conductive bottom layer 190 may be formed of or include, for example, CrN.

Figure 5A:
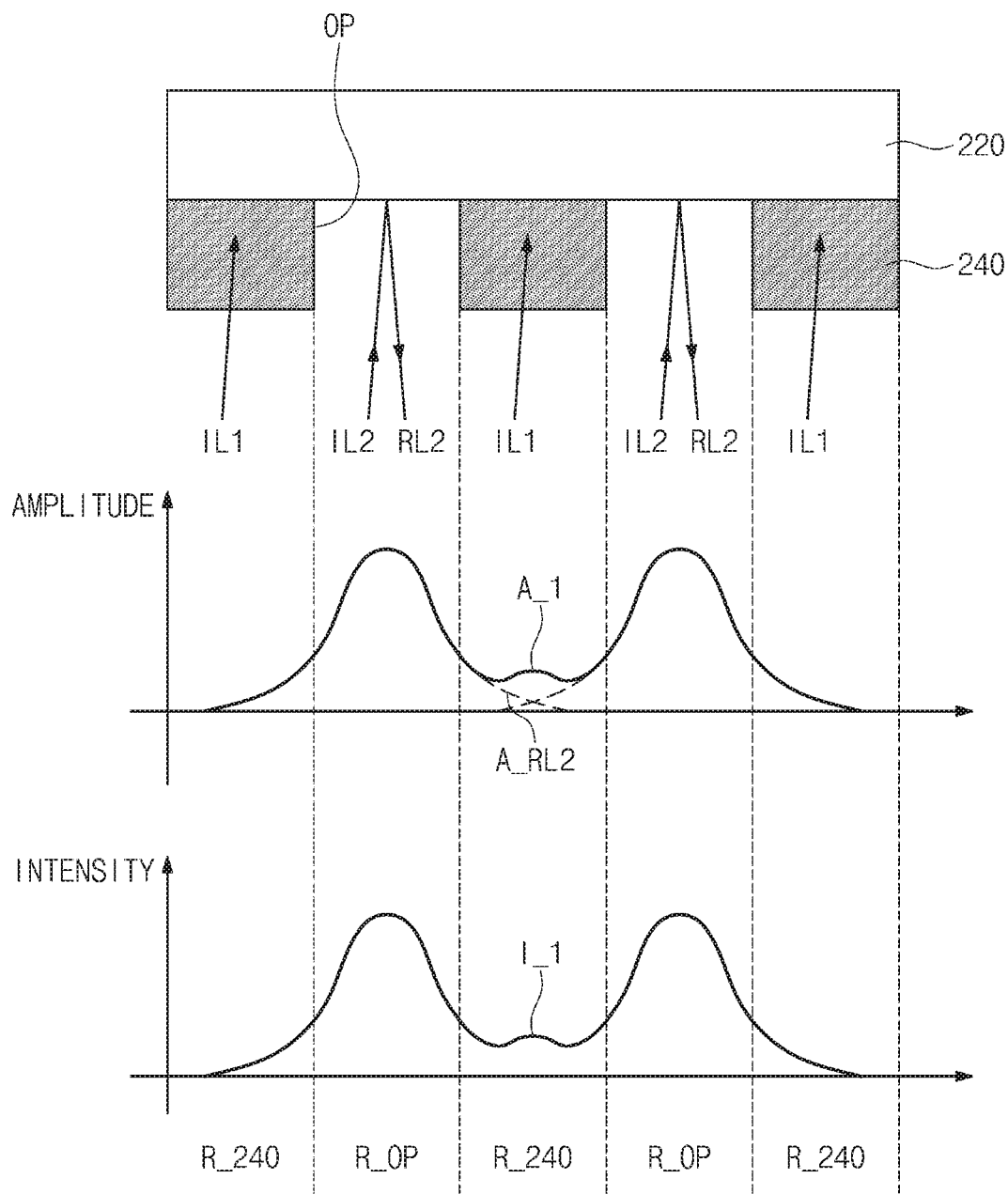
FIG. 5A is graphs showing amplitude and intensity characteristics of EUV light at a photoresist layer, when a conventional binary mask for EUV lithography is used in an exposure process.

FIG. 5A is graphs showing amplitude and intensity characteristics of EUV light at a photoresist layer, when a conventional binary mask for EUV lithography is used in an exposure process.

Referring to FIG. 5A, a conventional EUV binary mask may include absorption patterns 240 formed on a reflection layer 220. The absorption patterns 240 may absorb most of an incident EUV light IL1 to be incident thereto. For example, reflectivity of the incident EUV light IL1 to be incident to the absorption patterns 240 may be about 2% or lower. Thus, in an exposure process using the conventional EUV binary mask, most of EUV light to be incident to a photoresist layer may originate from a reflected EUV light RL2, which passes through the openings OP and is reflected by the reflection layer 220.

However, as a result of diffraction of the EUV light, a part of the reflected EUV light RL2 may be incident into a region R_240 of a photoresist layer corresponding to the absorption patterns 240. For example, at the photoresist layer, the reflected EUV light RL2 may have an amplitude depicted by the dotted line A_RL2 of FIG. 5A. In reality, however, the resulting amplitude of the EUV light to be incident into the photoresist layer may be the same shape as depicted by the solid line A_1 of FIG. 5A, owing to constructive interference between beams of the reflected EUV light RL2 reflected through the openings OP. In this case, the resulting intensity of the EUV light to be incident into the photoresist layer may be the same shape as depicted by the solid line I_1 in the lower graph of FIG. 5A.

That is, in the case where the conventional EUV binary mask is used to perform an exposure process, owing to the diffraction of the EUV light, a considerable amount of EUV light may be incident into the region R_240 of the photoresist layer corresponding to the absorption patterns 240. Also, a spatial change rate in the intensity I_1 of the EUV light (e.g., a gradient of the intensity I_1) may not have a large value, near a boundary between two regions (e.g., R_240 and R_OP) of the photoresist layer corresponding to the absorption patterns 240 and the openings OP. This may lead to deterioration in structural properties (e.g., line width roughness and critical dimension (CD) uniformity) of photoresist patterns, which may be formed through a subsequent developing process.

Figure 5B:
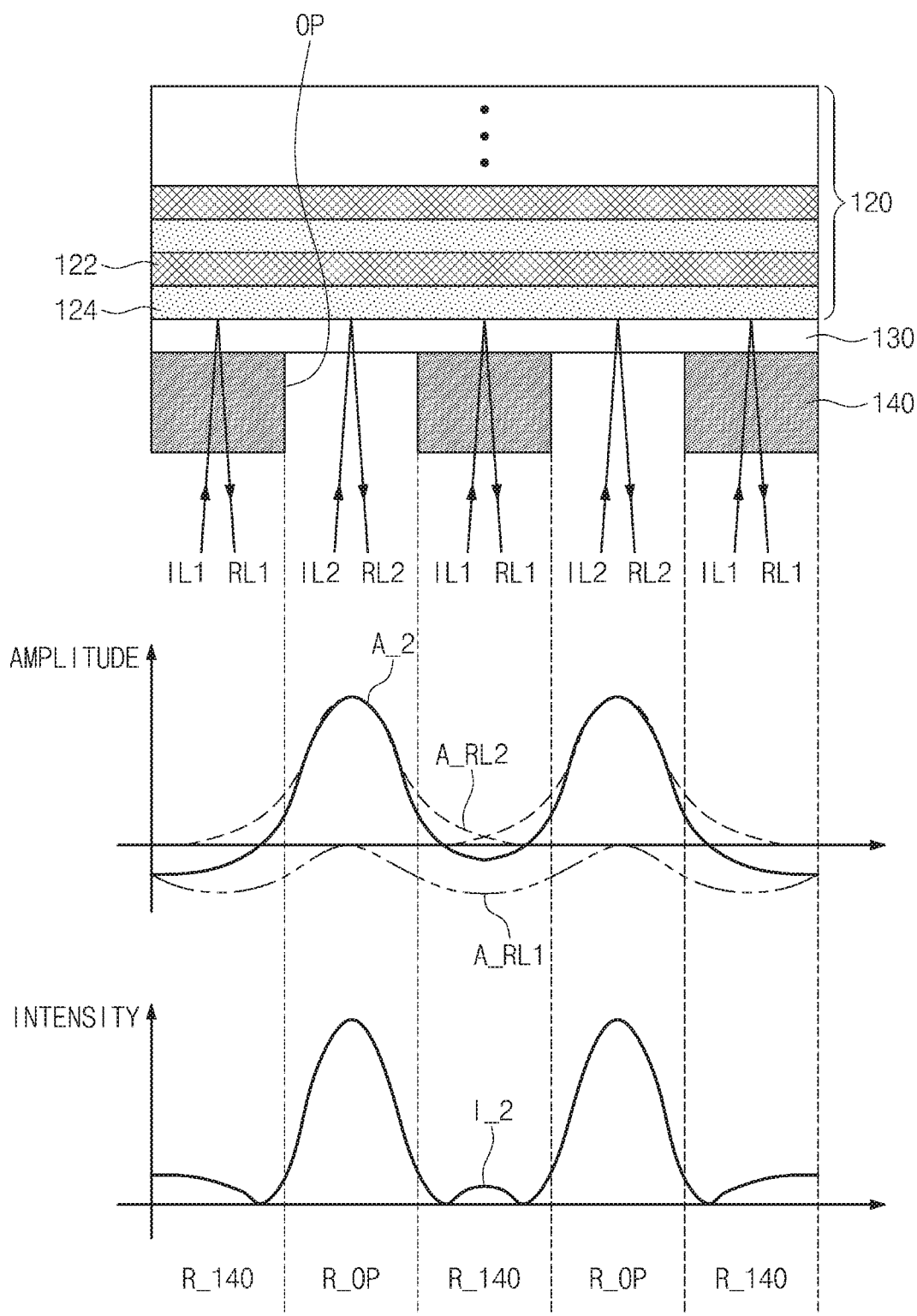
FIG. 5B is graphs showing amplitude and intensity characteristics of EUV light at a photoresist layer, when an EUV phase-shift mask according to some example embodiments of inventive concepts is used in an exposure process.

FIG. 5B is graphs showing amplitude and intensity characteristics of EUV light at a photoresist layer, when an EUV phase-shift mask according to some example embodiments of inventive concepts is used in an exposure process. For example, FIG. 5B is graphs showing amplitude and intensity characteristics of EUV light at a photoresist layer, when the EUV phase-shift mask described with reference to FIGS. 3 and 4 is used in an exposure process.

Referring to FIG. 5B, reflected EUV lights RL1 and RL2, which passed through the phase-shift patterns 140 and the openings OP respectively and are reflected by the reflection layer 120, may be incident into a photoresist layer.

As depicted by a second dotted line A_RL2, an amplitude of the reflected EUV light RL2 at the photoresist layer may be substantially the same as that described with reference to FIG. 5A.

The reflected EUV lights RL1 and RL2 may have a phase difference of about 160° to about 200°, and the reflected EUV light RL1 may have intensity smaller than that of the reflected EUV light RL2. The amplitude of the reflected EUV light RL1 at the photoresist layer is depicted by a first dotted line A_RL1.

Since, owing to the presence of the phase-shift patterns 140, the reflected EUV lights RL1 and RL2 may have the phase difference of about 160° to about 200°, the reflected EUV lights RL1 and RL2 may be destructively interfered with each other. Thus, the resulting amplitude of the EUV light to be incident into the photoresist layer may be the same shape as depicted by a solid line A_2 of FIG. 5B. In this case, the resulting intensity of the EUV light to be incident into the photoresist layer may be the same shape as depicted by the solid line I_2 in the lower graph of FIG. 5B.

That is, in the case where the EUV phase-shift mask according to some example embodiments of inventive concepts is used in an exposure process, the reflected EUV lights RL1 and RL2 may be destructively interfered with each other, thereby decreasing intensity of the EUV light to be incident into the region R_140 of the photoresist layer corresponding to the phase-shift patterns 140. Also, a spatial change rate in the intensity I_2 of the EUV light (e.g., a gradient of the intensity I_2) may be increased near a boundary between two regions (e.g., R_140 and R_OP) of the photoresist layer corresponding to the absorption patterns 140 and the openings OP. Thus, in the case where the EUV phase-shift mask according to some example embodiments of inventive concepts is used to perform an exposure process, it may be possible to improve structural properties (e.g., line width roughness and critical dimension (CD) uniformity) of photoresist patterns, which will be formed by a subsequent developing process.

Figure 6A:
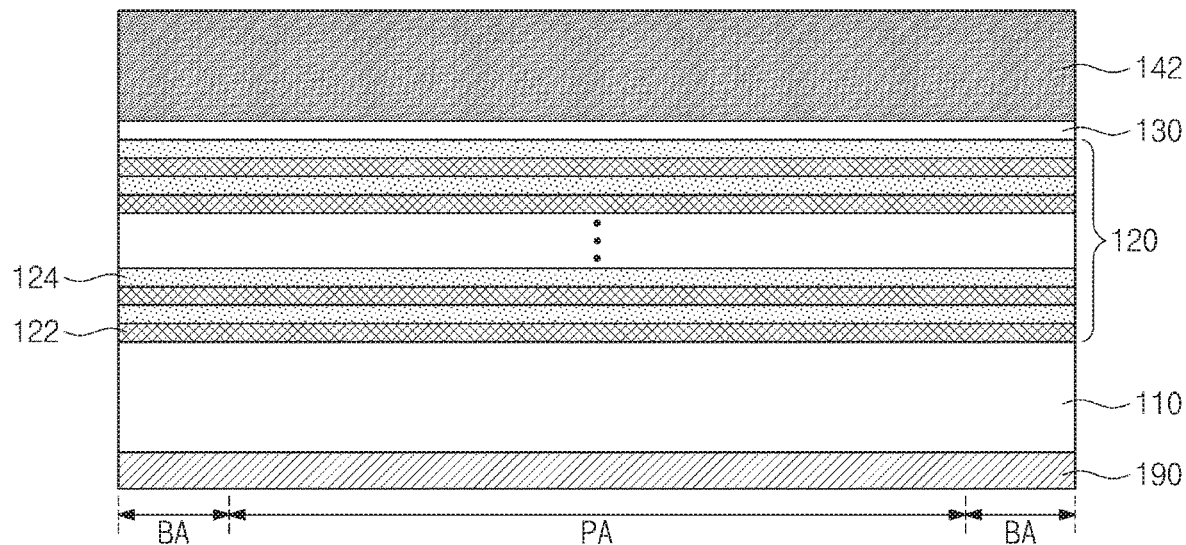
FIGS. 6A and 6B are sectional views illustrating a method of fabricating an EUV phase-shift mask according to some example embodiments of inventive concepts.
Figure 6B:
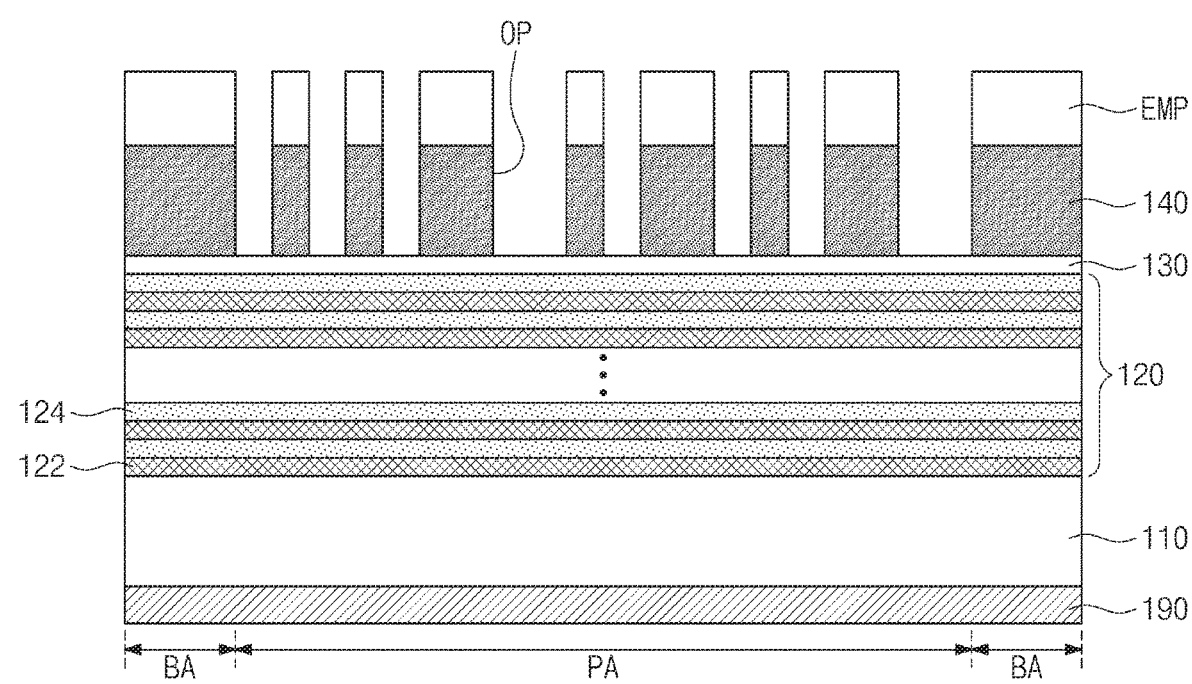

FIGS. 6A and 6B are sectional views illustrating a method of fabricating an EUV phase-shift mask according to some example embodiments of inventive concepts. For concise description, an element previously described with reference to FIGS. 3 and 4 may be identified by a similar or identical reference number without repeating an overlapping description thereof.

Referring to FIG. 6A, an EUV phase-shift mask blank including a substrate 110, a reflection layer 120, a capping layer 130, a phase-shift layer 142, and a conductive bottom layer 190 may be fabricated.

At first, the substrate 110 may be provided. The substrate 110 may include a material with a low thermal expansion coefficient. The substrate 110 may include a pattern region PA and a black border region BA which surrounds the pattern region PA. The pattern region PA and the black border region BA may correspond to the pattern region PA and the black border region BA, respectively, which were described with reference to FIG. 2.

The conductive bottom layer 190 may be formed on the bottom surface of the substrate 110. The conductive bottom layer 190 may be formed of or include, for example, CrN. The conductive bottom layer 190 may be formed by, for example, a sputtering deposition process.

The reflection layer 120 may be formed on the top surface of the substrate 110. The formation of the reflection layer 120 may include alternatingly and repeatedly forming a low-refractive-index layer 122 and a high-refractive-index layer 124. For example, the forming of the low- and high-refractive-index layers 122 and 124 may be repeated 20 to 80 times. For example, the low-refractive-index layer 122 may be formed of or include molybdenum (Mo), and the high-refractive-index layer 124 may be formed of or include silicon (Si). The low-refractive-index layer 122 and the high-refractive-index layer 124 may be formed by, for example, a sputtering deposition process.

The capping layer 130 may be formed on the reflection layer 120. The capping layer 130 may be formed of or include, for example, ruthenium (Ru). The capping layer 130 may be formed by, for example, a sputtering deposition process.

The phase-shift layer 142 may be formed on the capping layer 130. The phase-shift layer 142 may include the same material as that of the phase-shift patterns 140 described with reference to FIGS. 3 and 4. In some example embodiments, the phase-shift layer 142 may be formed of or include a material having a refractive index of about 0.9 to about 0.95 and an extinction coefficient of about 0.005 to about 0.3. In some example embodiments, the phase-shift layer 142 may be formed of or include a material having a refractive index of about 0.92 to about 0.95 and an extinction coefficient of about 0.1 to about 0.2. The phase-shift layer 142 may be formed by, for example, a sputtering deposition process.

As an example, in some example embodiments, the phase-shift layer 142 may be formed of or include one metal nitride. For example, the phase-shift layer 142 may include one of TiN, ZrN, and VN.

In some example embodiments, the phase-shift layer 142 may be formed of or include at least two metal nitrides. For example, the phase-shift layer 142 may include two of TaN, TiN, ZrN, HfN, CrN, VN, NbN, MoN, WN, AlN, GaN, ScN, and YN but are different from each other. In some example embodiments, by adjusting kinds of metal nitrides contained in the phase-shift layer 142 and/or a composition ratio thereof, it may be possible to easily control the refractive index and extinction coefficient of the phase-shift layer 142.

In other words, since a refractive index and an extinction coefficient of the phase-shift layer 142 are changed depending on the kinds of metal nitrides contained in the phase-shift layer 142 and the composition ratio thereof, it is possible to easily adjust (and/or optimize) the refractive index and extinction coefficient of the phase-shift layer 142.

The phase-shift layer 142 may include, for example, one metal nitride, which is selected from a first metal nitride group, and another metal nitride, which is selected from a second metal nitride group. The first metal nitride group may include TiN, HfN, TaN, WN, CrN, VN, and GaN. The second metal nitride group may include TiN, ZrN, MoN, NbN, and YN.

Furthermore, in some example embodiments, the phase-shift layer 142 may further contain a small amount of impurity. For example, the impurity may be at least one of Si, Ge, B, and H, but inventive concepts are not limited thereto.

Referring to FIG. 6B, the phase-shift patterns 140 may be formed. The formation of the phase-shift patterns 140 may include forming etch mask patterns EMP on the phase-shift layer 142 and patterning the phase-shift layer 142 using the etch mask patterns EMP as an etch mask. As a result of the patterning process, openings OP may be formed between the phase-shift patterns 140 to expose the capping layer 130 or the reflection layer 120.

Referring back to FIG. 3, the etch mask patterns EMP may be removed. Thereafter, a cleaning process may be performed to remove residues and/or impurities, which may remain on a resulting structure, from which the etch mask patterns EMP are removed.

Figure 7A:
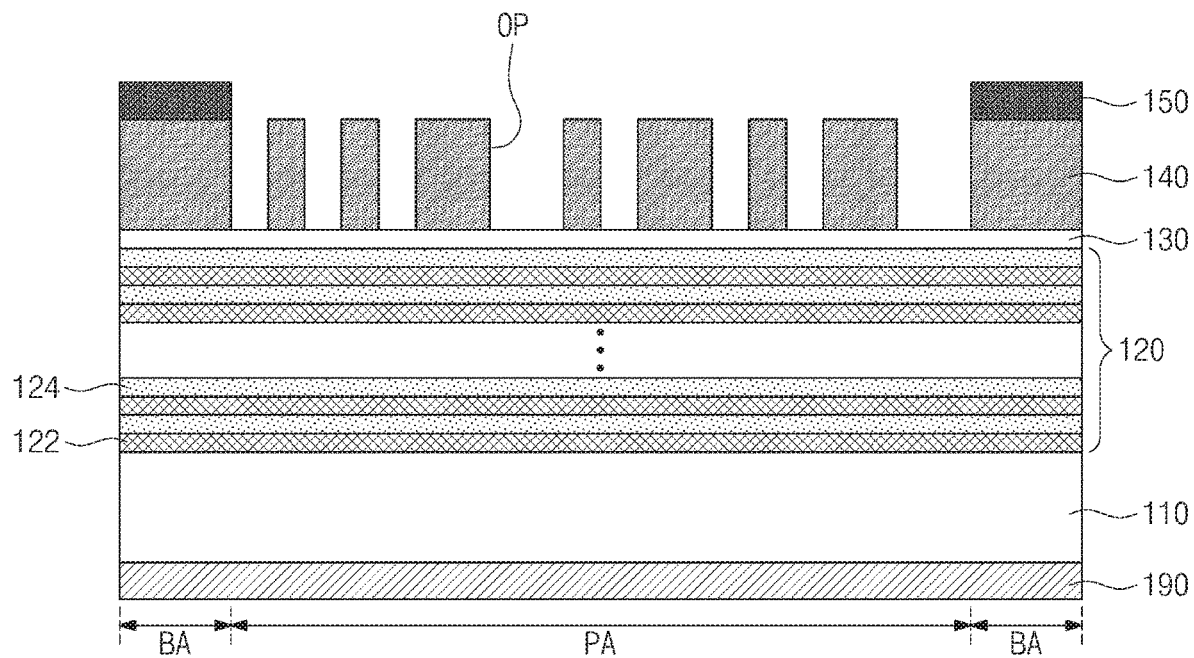
FIGS. 7A and 7B are schematic sectional views respectively illustrating EUV phase-shift masks according to some example embodiments of inventive concepts.
Figure 7B:
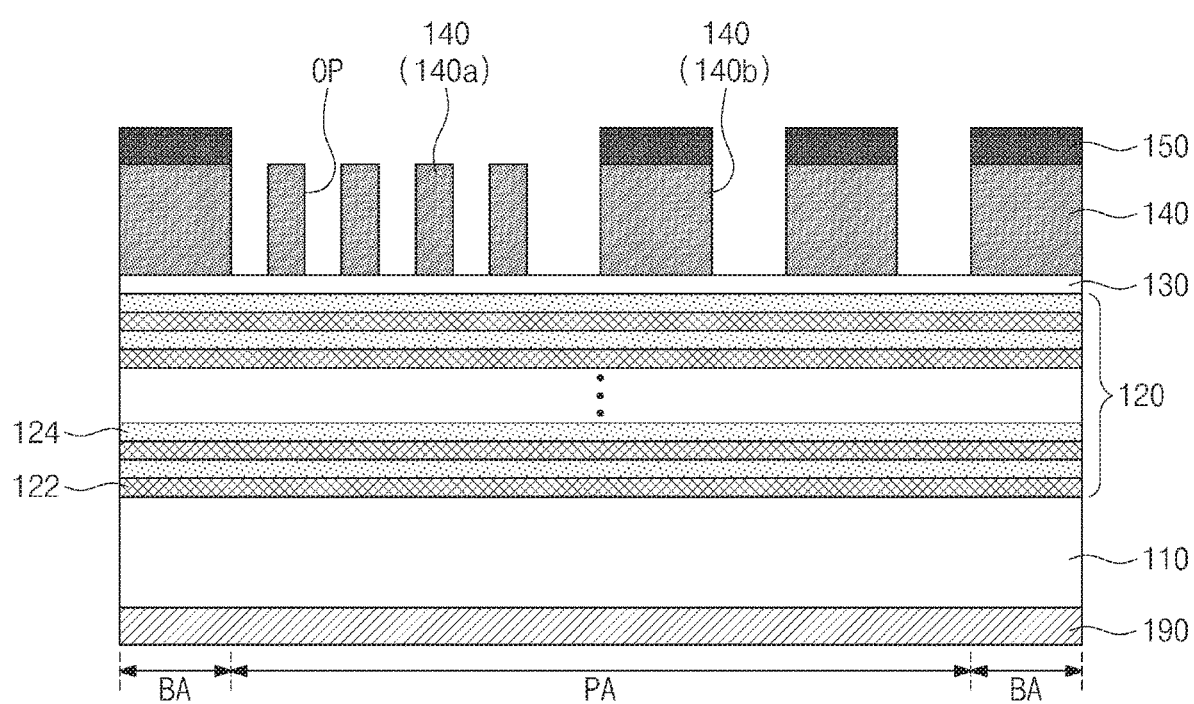
Figure 8:
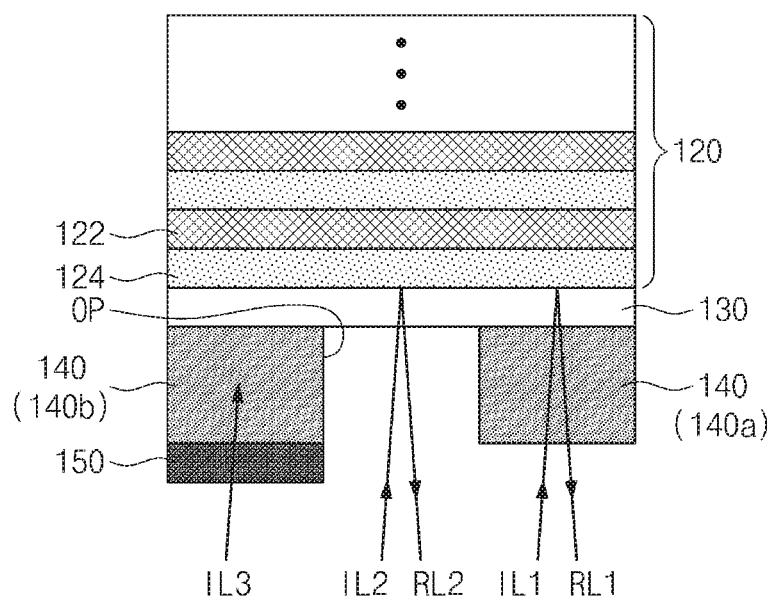
FIG. 8 is a schematic diagram that is provided to describe an optical behavior of EUV light, when the EUV light is reflected by an EUV phase-shift mask according to some example embodiments of inventive concepts.

FIGS. 7A and 7B are schematic sectional views respectively illustrating EUV phase-shift masks according to some example embodiments of inventive concepts. For example, an EUV phase-shift mask of FIGS. 7A and 7B may correspond to the phase-shift mask 100 previously described with reference to FIGS. 1 and 2. FIG. 8 is a schematic diagram that is provided to describe an optical behavior of EUV light, when the EUV light is reflected by an EUV phase-shift mask according to some example embodiments of inventive concepts.

Referring to FIGS. 7A and 7B, a phase-shift mask may further include light-blocking patterns 150, in addition to the substrate 110, the reflection layer 120, the capping layer 130, the phase-shift patterns 140, and the conductive bottom layer 190.

The substrate 110, the reflection layer 120, the capping layer 130, the phase-shift patterns 140, and the conductive bottom layer 190 may be configured to have substantially the same features as those described with reference to FIGS. 3 and 4. Thus, for concise description, such elements may be identified by the same reference number without repeating an overlapping description thereof.

The light-blocking patterns 150 may be provided on some of the phase-shift patterns 140. For example, the light-blocking patterns 150 may be provided on the phase-shift patterns 140 with a relatively large width, but may not be provided on the phase-shift patterns 140 with a relatively small width.

In some example embodiments, as shown in FIG. 7A, the light-blocking patterns 150 may be provided on the phase-shift patterns 140 on the black border region BA, but may not be provided on the phase-shift patterns 140 on the pattern region PA.

In some example embodiments, as shown in FIG. 7B, the phase-shift patterns 140 on the pattern region PA may include first phase-shift patterns 140a with a relatively small width and second phase-shift patterns 140b with a relatively large width. In some example embodiments, the light-blocking patterns 150 may be provided on the phase-shift patterns 140 on the black border region BA and the second phase-shift patterns 140b but may not be provided on the first phase-shift patterns 140a.

The light-blocking patterns 150 may be formed of or include a material whose absorption coefficient is higher than that of the phase-shift patterns 140. For example, the light-blocking patterns 150 may be formed of or include chromium and/or chromium nitride. The light-blocking patterns 150 may have a thickness that is smaller than that of the phase-shift patterns 140.

Referring further to FIG. 8, the light-blocking pattern 150 may have high absorptivity to an incident EUV light IL3. Accordingly, reflectivity of the incident EUV light IL3 passing through the phase-shift pattern 140b covered with the light-blocking pattern 150 may be lower than that of the incident EUV light IL passing through the phase-shift pattern 140a, on which the light-blocking pattern 150 is not provided. For example, the reflectivity of the incident EUV light IL3 passing through the phase-shift pattern 140b, on which the light-blocking pattern 150 is provided, may be 2% or less.

The incident EUV light IL1, the incident EUV light IL2, the reflected EUV light RL1, and the reflected EUV light RL2 may exhibit substantially the same optical characteristics as those described with reference to FIG. 4. Here, the incident EUV light IL1 may be incident into the phase-shift pattern 140a, on which the light-blocking pattern 150 is not provided, and the incident EUV light IL2 may be incident to the reflection layer 120 through the opening OP. The reflected EUV light RL1 may be reflected by the reflection layer 120 through the phase-shift patterns 140a, on which the light-blocking pattern 150 is not provided, and the reflected EUV light RL2 may be reflected by the reflection layer 120 through the opening OP.

For example, the reflectivity of the incident EUV light IL1 may range from about 4% to about 30%. The reflectivity of the incident EUV light IL2 may range from about 60% to about 75%. The reflected EUV light RL1 and the reflected EUV light RL2 may have a phase difference of about 160° to about 200°.

Figure 9A:
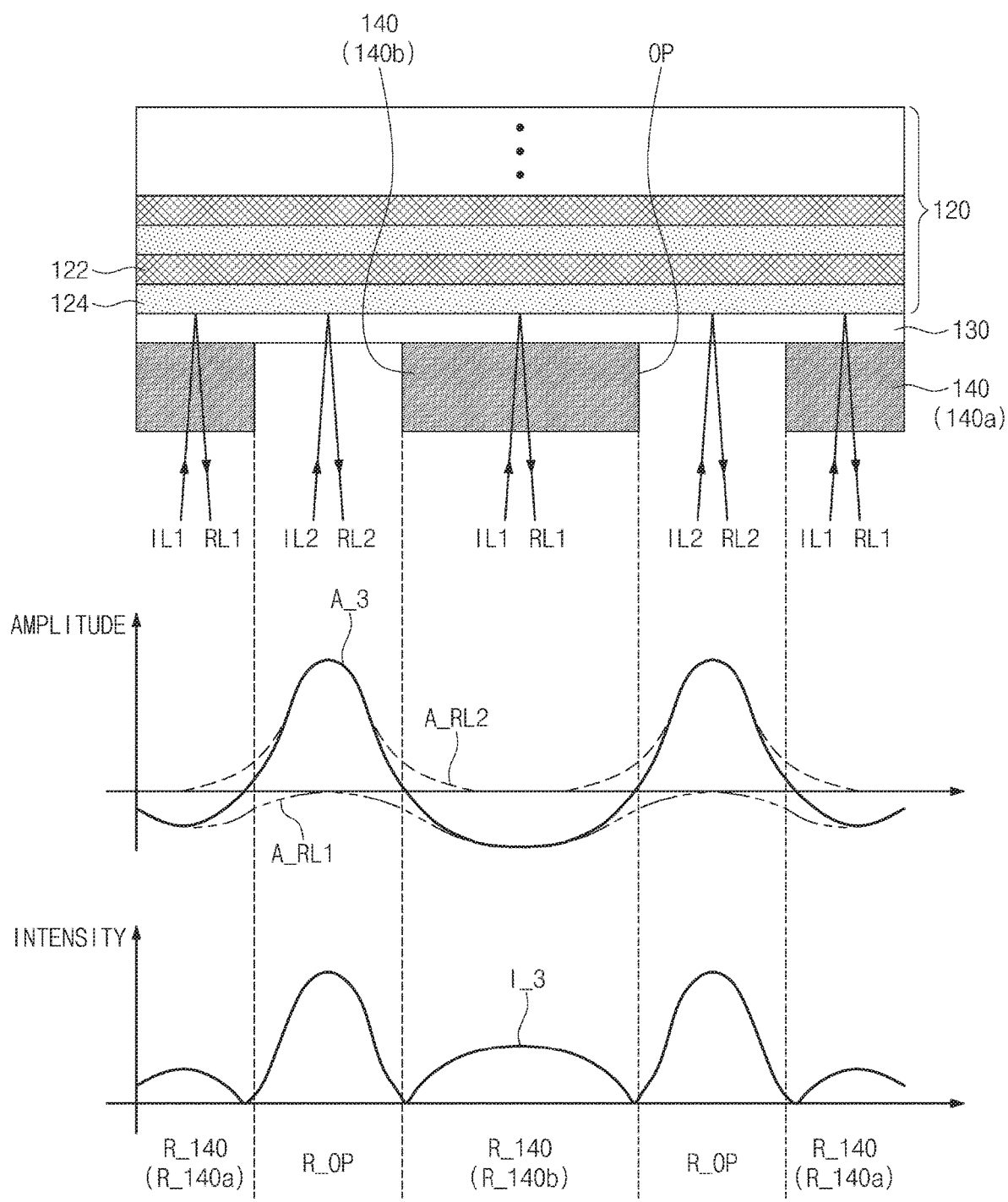
FIGS. 9A and 9B are graphs showing amplitude and intensity characteristics of EUV light at a photoresist layer, when an EUV phase-shift mask according to some example embodiments of inventive concepts is used in an exposure process.
Figure 9B:
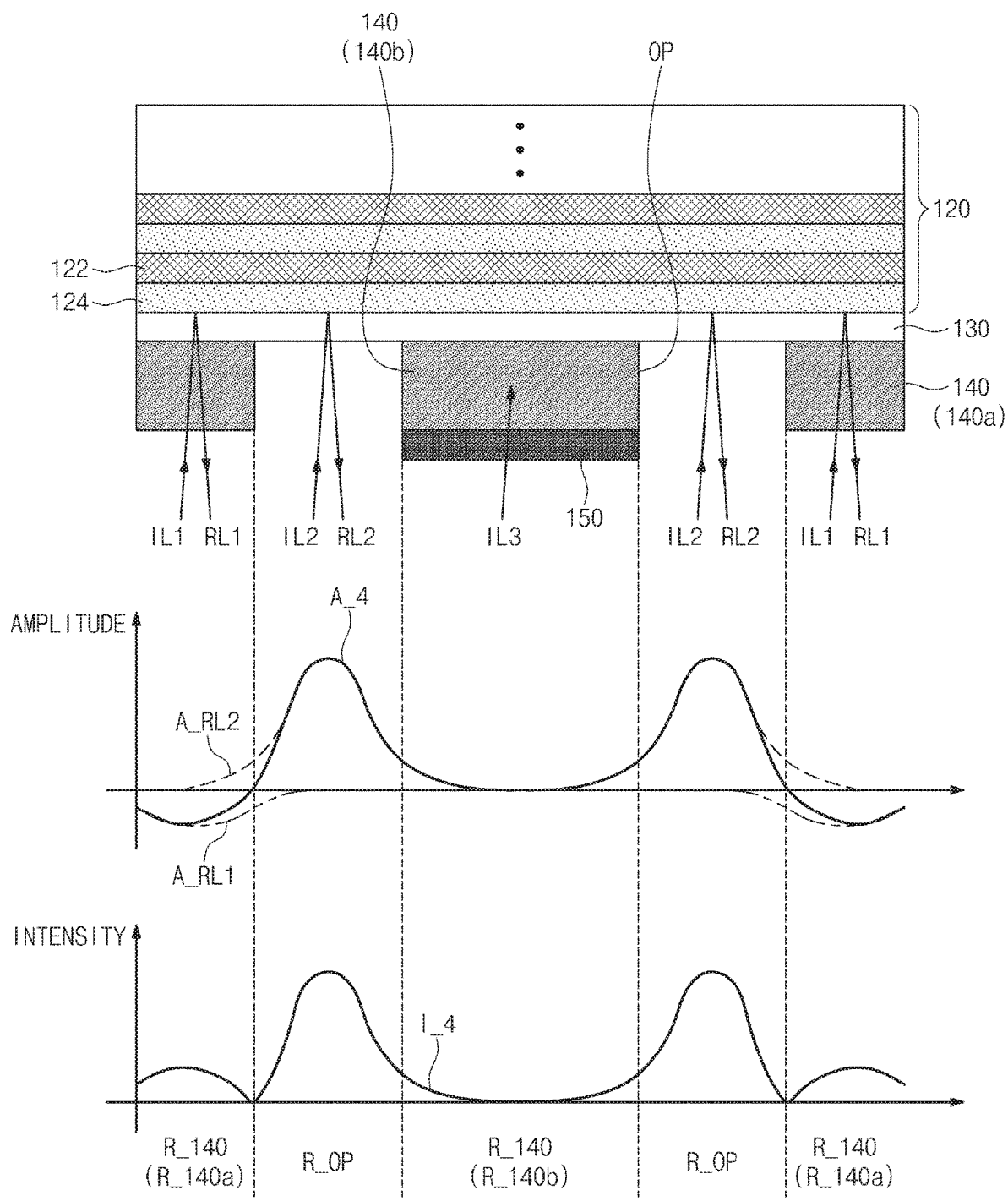

FIGS. 9A and 9B are graphs showing amplitude and intensity characteristics of EUV light at a photoresist layer, when an EUV phase-shift mask according to some example embodiments of inventive concepts is used in an exposure process. For example, the EUV phase-shift mask of FIG. 9A may be configured in such a way that any light-blocking pattern is not provided on phase-shift patterns. By contrast, the EUV phase-shift mask of FIG. 9B may be configured in such a way that a light-blocking pattern is provided on a phase-shift pattern with a relatively large width.

Referring to FIG. 9A, a photoresist layer may be irradiated with the reflected EUV light RL1 and RL2, which are reflected through the phase-shift pattern 140 and the openings OP, respectively. A first dotted line A_RL1 shows amplitude of the reflected EUV light RL1 at the photoresist layer. A second dotted line A_RL2 shows amplitude of the reflected EUV light RL2 at the photoresist layer.

Since, owing to the presence of the phase-shift patterns 140, the reflected EUV lights RL1 and RL2 have the phase difference of about 160° to about 200°, the reflected EUV lights RL1 and RL2 may be destructively interfered with each other. Thus, the resulting amplitude of the EUV light to be incident into the photoresist layer may be the same shape as depicted by a solid line A_3 of FIG. 9A. In this case, the resulting intensity of the EUV light to be incident into the photoresist layer may be the same shape as depicted by the solid line I_3 in the lower graph of FIG. 9A.

In other words, the reflected EUV lights RL1 and RL2 may be destructively interfered near a boundary between two regions (e.g., R_140 and R_OP) of the photoresist layer corresponding to the phase-shift patterns 140 and the openings OP, and thus, a spatial change rate (e.g., the gradient) of intensity I_3 of the EUV light may be increased. However, the destructive interference between the reflected EUV lights RL1 and RL2 may not occur near a center of a region R_140b of the photoresist layer corresponding to the phase-shift pattern 140b with the relatively large width, and this may lead to unintended exposure. Furthermore, as a result of the unintended exposure, an unintended photoresist pattern may be formed near the center of the region R_140b of the photoresist layer corresponding to the phase-shift pattern 140b with the relatively large width.

Referring to FIG. 9B, since the light-blocking pattern 150 is provided on the phase-shift pattern 140b with the relatively large width, most of the incident EUV light IL3 to be incident to the phase-shift pattern 140b with the relatively large width may be absorbed by the light-blocking pattern 150. Thus, the photoresist layer may be irradiated by the reflected EUV light RL2 to be reflected through the openings OP and by the reflected EUV light RL1 to be reflected through the phase-shift pattern 140a with the relatively small width. It may be possible to limit and/or prevent the photoresist layer from being irradiated by EUV light, which is reflected through the phase-shift pattern 140b with the relatively large width.

A second dotted line A_RL2 shows amplitude of the reflected EUV light RL2, which is reflected through the openings OP, at the photoresist layer. A first dotted line A_RL1 shows amplitude of the reflected EUV light RL1, which is reflected through the phase-shift pattern 140a with the relatively small width, at the photoresist layer.

Since the reflected EUV light RL1 and the reflected EUV light RL2 have a phase difference of about 160° to about 200°, d the reflected EUV light RL1 and the reflected EUV light RL2 may be destructively interfered with each other. Thus, the resulting amplitude of the EUV light to be incident into the photoresist layer may be the same shape as depicted by a solid line A_4 of FIG. 9B. In this case, the resulting intensity of the EUV light to be incident into the photoresist layer may be the same shape as depicted by the solid line I_4 in the lower graph of FIG. 9B.

In other words, the destructive interference between the reflected EUV lights RL1 and RL2 may make it possible to lower the intensity of EUV light to be incident to a region R_140a of the photoresist layer corresponding to the phase-shift patterns 140a with the relatively small width. Furthermore, a spatial change rate in intensity of EUV light (e.g., gradient of the intensity) may be increased near a boundary between two regions (e.g., R_140a and R_OP) of the photoresist layer corresponding to the phase-shift patterns 140a with the relatively small width and the openings OP.

In addition, since the incident EUV light IL3 to be incident to the phase-shift pattern 140b with the relatively large width is substantially limited and/or prevented from being reflected, it may be possible to limit and/or prevent an unintended exposure from occurring near the center of the region R_140b of the photoresist layer corresponding to the phase-shift pattern 140b with the relatively large width, unlike that described with reference to FIG. 9A.

Figure 10A:
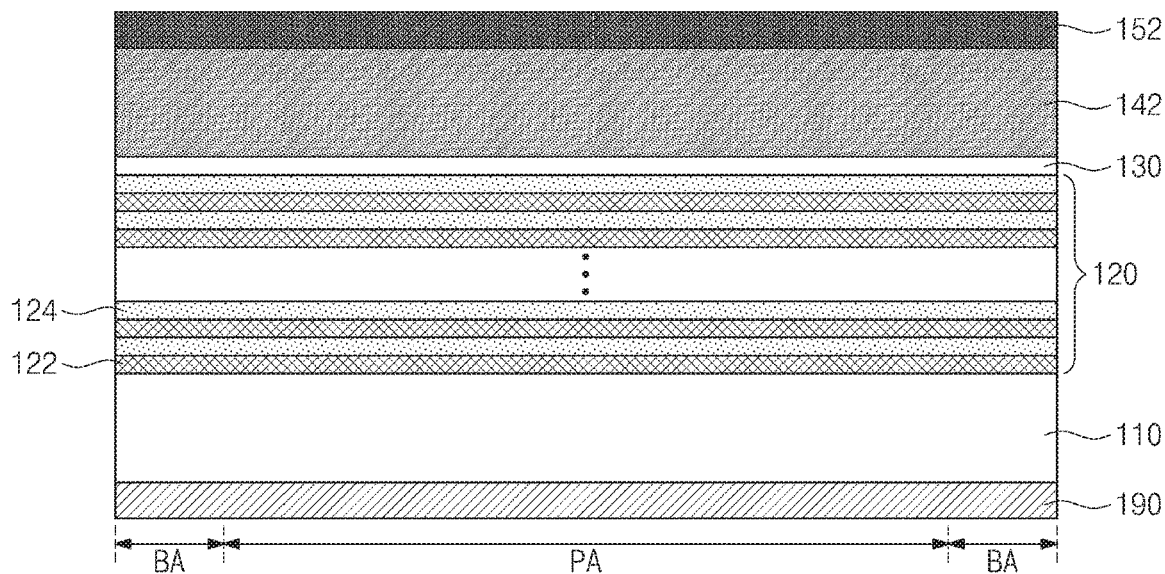
FIGS. 10A to 10C are sectional views illustrating a method of fabricating an EUV phase-shift mask according to some example embodiments of inventive concepts.
Figure 10B:
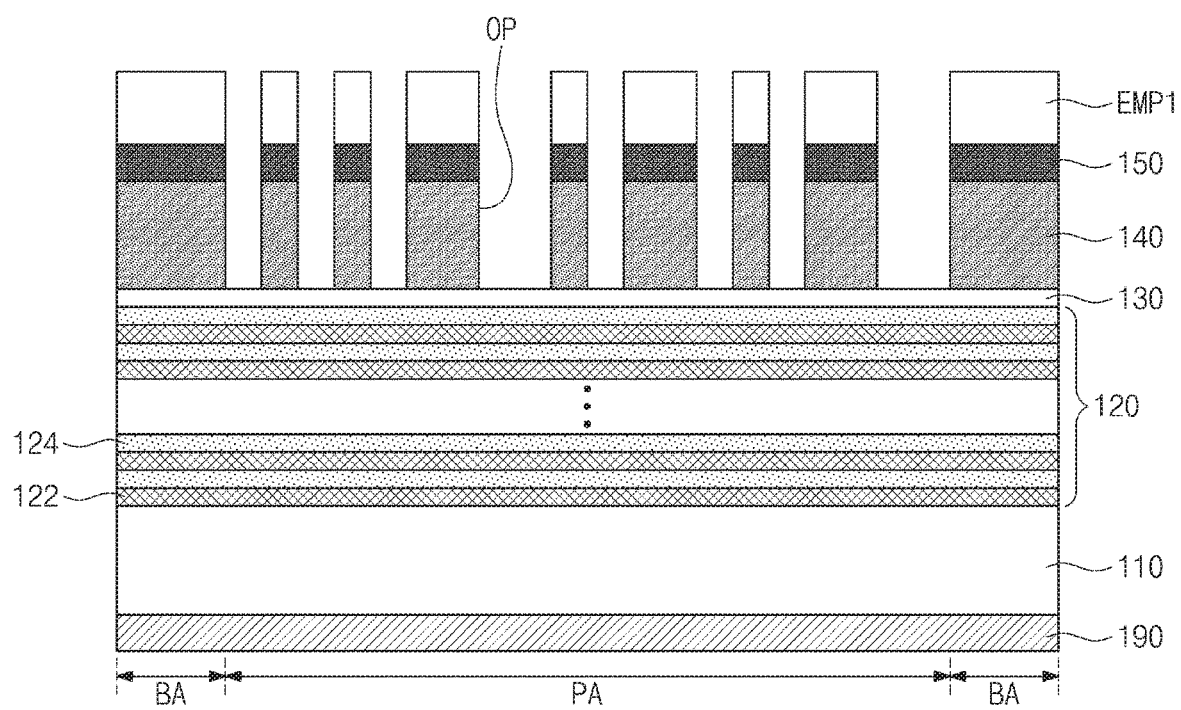
Figure 10C:
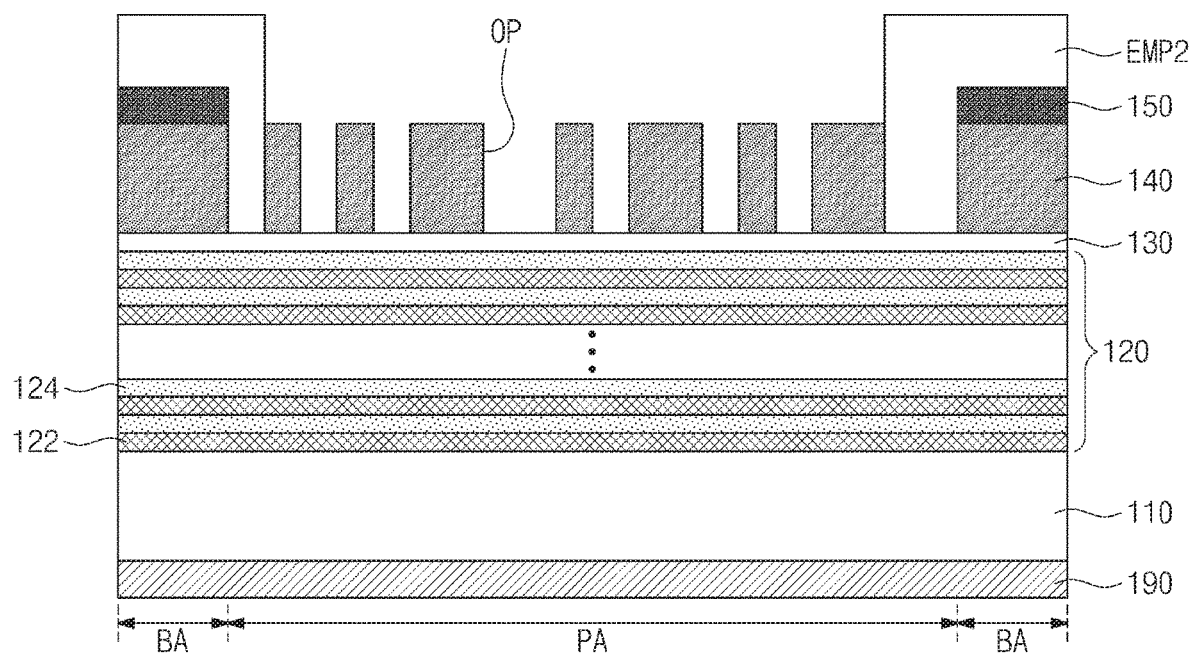

FIGS. 10A to 10C are sectional views illustrating a method of fabricating an EUV phase-shift mask according to some example embodiments of inventive concepts. For concise description, an element previously described with reference to FIGS. 7A and 7B may be identified by a similar or identical reference number without repeating an overlapping description thereof.

Referring to FIG. 10A, an EUV phase-shift mask blank including a substrate 110, a reflection layer 120, a capping layer 130, a phase-shift layer 142, a light-blocking layer 152, and a conductive bottom layer 190 may be fabricated.

The conductive bottom layer 190 may be formed on a bottom surface of the substrate 110, and the reflection layer 120, the capping layer 130, and the phase-shift layer 142 may be sequentially formed on a top surface of the substrate 110. These layers may be formed by the same method as described with reference to FIG. 6A.

The light-blocking layer 152 may be formed on the phase-shift layer 142. The light-blocking layer 152 may be formed of or include a material having an extinction coefficient higher than that of the phase-shift layer 142. For example, the light-blocking layer 152 may include chromium and/or chromium nitride. The light-blocking layer 152 may be formed by, for example, a sputtering deposition process.

Referring to FIG. 10B, the phase-shift patterns 140 and the light-blocking patterns 150 on the phase-shift patterns 140 may be formed. The formation of the phase-shift patterns 140 and the light-blocking patterns 150 may include forming first etch mask patterns EMP1 on the light-blocking layer 152 and sequentially patterning the light-blocking layer 152 and the phase-shift layer 142 using the first etch mask patterns EMP1 as an etch mask. As a result of the patterning process, the openings OP may be formed between the phase-shift patterns 140 to expose the capping layer 130 or the reflection layer 120. After the patterning process, the first etch mask pattern EMP1 may be removed.

Referring to FIG. 10C, some of the light-blocking patterns 150 may be removed. The removal of some of the light-blocking patterns 150 may include forming second etch mask patterns EMP2 to expose some of the light-blocking patterns 150 and selectively etching some of the light-blocking patterns 150 exposed by the second etch mask patterns EMP2.

In some example embodiments, as shown in FIG. 10C, the second etch mask patterns EMP2 may be formed to cover the phase-shift patterns 140 on the black border region BA and expose the phase-shift patterns 140 on the pattern region PA.

In some example embodiments, similar to that shown in FIG. 7B, the phase-shift patterns 140 on the pattern region PA may include the first phase-shift patterns 140a with a relatively small width and the second phase-shift patterns 140b with a relatively large width. In some example embodiments, the second etch mask patterns EMP2 may be formed to cover the phase-shift patterns 140 on the black border region BA and the second phase-shift patterns 140b and expose the first phase-shift patterns 140a.

Referring back to FIG. 7A or 7B, the second etch mask patterns EMP2 may be removed. Thereafter, a cleaning process may be performed to remove residues and/or impurities, which may remain on a resulting structure, from which the second etch mask patterns EMP2 are removed.

According to some example embodiments of inventive concepts, by adjusting kinds of metal nitrides contained in phase-shift patterns and/or a composition ratio thereof, it may be possible to easily control refractive index and extinction coefficient of the phase-shift patterns. In other words, since a refractive index and an extinction coefficient of the phase-shift patterns are changed depending on the kinds of metal nitrides contained in the phase-shift patterns and the composition ratio thereof, it is possible to easily adjust (and/or optimize) the refractive index and extinction coefficient of the phase-shift patterns.

According to some example embodiments of inventive concepts, a gradient of intensity of extreme ultraviolet light can be increased at a boundary between two regions of a photoresist layer corresponding to phase-shift patterns and openings region. Accordingly, it is possible to improve structural properties (e.g., line width roughness and critical dimension (CD) uniformity) of photoresist patterns, which will be formed by a subsequent developing process.

While some example embodiments of inventive concepts have been particularly shown and described, it will be understood by one of ordinary skill in the art that variations in form and detail may be made therein without departing from the spirit and scope of the attached claims.

What is claimed is:
1. A phase-shift mask for extreme ultraviolet (EUV) lithography, comprising:
 a substrate;
 a reflection layer on the substrate, the reflection layer including a plurality of first layers and a plurality of second layers alternately stacked on top of each other, and a refractive index of the plurality of first layers is greater than a refractive index of the plurality of second layers; and
 phase-shift patterns including one or more first phase-shift patterns and one or more second phase-shift patterns on the reflection layer,
 the one or more first phase-shift patterns being laterally spaced apart from the one or more second phase-shift patterns, a width of the second phase-shift patterns being wider than a width of the first phase-shift patterns; and
 light-blocking patterns on the second phase-shift patterns, wherein the light-blocking patterns are not on the first phase-shift patterns,
 wherein the phase-shift patterns consist of metal nitride patterns and the metal nitride patterns are formed of at least one of HfN, VN, AlN, GaN, ScN, or YN,
 wherein the phase-shift mask is a reflection-type mask, and
 wherein a thickness of the light-blocking patterns is less than a thickness of the phase-shift patterns, and
 a width of the light-blocking patterns is the same as the width of the second phase-shift patterns.
2. The phase-shift mask of claim 1, wherein a reflectivity of EUV light incident to the phase-shift patterns ranges from 4% to 30%.
3. The phase-shift mask of claim 1, wherein the phase-shift patterns have a refractive index in a range of 0.90 to 0.95 and an extinction coefficient in a range of 0.005 to 0.030.
4. The phase-shift mask of claim 1, wherein the phase-shift patterns have a refractive index in a range of 0.92 to 0.95 and an extinction coefficient in a range of 0.01 to 0.02.
5. The phase-shift mask of claim 1, wherein an extinction coefficient of the light-blocking patterns is higher than an extinction coefficient of the phase-shift patterns.
6. The phase-shift mask of claim 1, wherein the metal nitride patterns are formed of VN.

7. The phase-shift mask of claim 1, wherein the plurality of first layers are formed of silicon (Si) and the plurality of second layers are formed of molybdenum (Mo).

8. A phase-shift mask for extreme ultraviolet (EUV) lithography, comprising:
a substrate;
a reflection layer on the substrate, the reflection layer including the reflection layer including a plurality of first layers and a plurality of second layers alternately stacked on top of each other, and a refractive index of the plurality of first layers is greater than a refractive index of the plurality of second layers;
phase-shift patterns including one or more first phase-shift patterns and one or more second phase-shift patterns on the reflection layer,
the one or more first phase-shift patterns being laterally spaced apart from the one or more second phase-shift patterns, a width of the second phase-shift patterns being wider than a width of the first phase-shift patterns; and
light-blocking patterns on the second phase-shift patterns, wherein the light-blocking patterns are not on the first phase-shift patterns,
wherein the phase-shift patterns consist of metal nitride patterns and the metal nitride patterns are formed of two different metal nitrides, and the two different metal nitrides are formed of two different ones of TiN, HfN, VN, WN, AlN, GaN, ScN, or YN,
wherein a thickness of the light-blocking patterns is, less than a thickness of the phase-shift patterns,
wherein the phase-shift mask is a reflection-type mask, and
wherein a width of the light-blocking patterns is the same as the width of the second phase-shift patterns.

9. The phase-shift mask of claim 8, wherein
a first one of the two different metal nitrides is formed of HfN, VN, or GaN.

10. The phase-shift mask of claim 8, wherein
the phase-shift patterns define an opening through a thickness direction of the phase-shift patterns, and
the phase-shift patterns are configured to change a phase of EUV light passing through phase-shift patterns by 160° to 200°, compared to EUV light passing through the opening.

11. The phase-shift mask of claim 8, wherein
EUV light reflected along a path passing through the phase-shift patterns has a reflectivity ranging from 4% to 30%.

12. The phase-shift mask of claim 8, wherein
an extinction coefficient of the light-blocking patterns is higher than an extinction, coefficient of the phase-shift patterns.

13. A phase-shift mask, comprising:
a substrate;
a reflection layer on the substrate, the reflection layer including a plurality of first layers and a plurality of second layers alternately stacked on top of each other, and a refractive index of the plurality of first layers is greater than a refractive index of the plurality of second layers;
phase-shift patterns including one or more first phase-shift patterns and one or more second phase-shift patterns on the reflection layer,
the one or more first phase-shift patterns being laterally spaced apart from the one or more second phase-shift patterns, a width of the second phase-shift patterns being wider than a width of the first phase-shift patterns; and
light-blocking patterns on the second phase-shift patterns, wherein,
an extinction coefficient of the light-blocking patterns is higher than the extinction coefficient of the phase-shift patterns,
the light-blocking patterns are not on the first phase-shift patterns,
the phase-shift patterns consist of at least one metal nitride,
the at least one metal nitride includes a first metal nitride and a second metal nitride,
the first metal nitride being formed of HfN, WN, VN, or GaN, and
the second metal nitride being formed of ZrN, MoN, NbN, or YN; and
a thickness of the light-blocking patterns is less than a thickness of the phase-shift patterns, and a width of the light-blocking patterns is the same as the width of the second phase-shift patterns.

14. The phase-shift mask of claim 13, further comprising:
a capping layer between the reflection layer and the phase-shift patterns.

15. The phase-shift mask of claim 13, wherein
the substrate includes a pattern region and a black border region surrounding the pattern region,
the light-blocking patterns are on the phase-shift patterns that are on the black border region, and
the light-blocking patterns are not on the phase-shift patterns that are on the pattern region.

16. The phase-shift mask of claim 13, wherein
the substrate includes a pattern region and a black border region surrounding the pattern region,
the phase-shift patterns that are on the pattern regio include the first phase-shift patterns and the second phase-shift patterns, and
the light-blocking patterns are on the black border region.

17. The phase-shift mask of claim 13, wherein
the reflection layer has a flat top surface, and
the phase-shift patterns are on the flat top surface of the reflection layer.

18. The phase-shift mask of claim 13, wherein
the phase-shift patterns define an opening, and
the phase-shift patterns are configured to change a phase of EUV light passing through the phase-shift patterns by 160° to 200°, compared to EUV light passing through the opening.

19. The phase-shift mask of claim 13, further comprising:
anti-reflection patterns between the phase-shift patterns and the light-blocking patterns, wherein
the light-blocking patterns are formed of chromium or chromium nitride.

20. The phase-shift mask of claim 13, wherein the plurality of first layers are formed of silicon (Si) and the plurality of second layers are formed of molybdenum (Mo).

* * * * *